(12) United States Patent
Chao

(10) Patent No.: US 7,879,511 B2
(45) Date of Patent: Feb. 1, 2011

(54) SEQUENTIAL LATERAL SOLIDIFICATION MASK

(75) Inventor: Chih-Wei Chao, Taipei (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 11/368,634

(22) Filed: Mar. 7, 2006

(65) Prior Publication Data

US 2006/0276013 A1    Dec. 7, 2006

(30) Foreign Application Priority Data

Jun. 3, 2005    (TW) ............................... 94118439 A

(51) Int. Cl.
G03F 1/00    (2006.01)
(52) U.S. Cl. ......................................... 430/5; 349/110
(58) Field of Classification Search ............... 430/5; 349/1
See application file for complete search history.

(56) References Cited

U.S. PATENT DOCUMENTS

| | | | |
|---|---|---|---|
| 6,573,163 B2 | 6/2003 | Voutsas et al. | |
| 6,726,768 B2 | 4/2004 | Yoon | |
| 6,867,151 B2 | 3/2005 | Jung et al. | |
| 2002/0197759 A1 | 12/2002 | Yang | |
| 2003/0040146 A1 | 2/2003 | Kang et al. | |
| 2004/0173800 A1* | 9/2004 | Park et al. ...................... | 257/72 |
| 2004/0224487 A1 | 11/2004 | Yang | |
| 2005/0081780 A1* | 4/2005 | Park et al. ...................... | 117/43 |
| 2005/0139580 A1* | 6/2005 | Seo et al. .................. | 219/121.6 |
| 2005/0142451 A1* | 6/2005 | You .............................. | 430/5 |
| 2005/0233224 A1* | 10/2005 | Tseng et al. .................... | 430/5 |

FOREIGN PATENT DOCUMENTS

| | | |
|---|---|---|
| TW | 227913 | 2/2005 |
| TW | 231046 | 4/2005 |

* cited by examiner

*Primary Examiner*—N Drew Richards
*Assistant Examiner*—Jae Lee
(74) *Attorney, Agent, or Firm*—Birch, Stewart, Kolasch & Birch, LLP

(57) ABSTRACT

A mask used in a sequential lateral solidification process to fabricate a multi-boundary polysilicon. The mask comprises a first portion, a second portion and a third portion. The first and the third portions are translucent to light, and the second portion is opaque. These three portions have the same shape but different sizes. The first portion surrounds the second portion, and the third portion is parallel to both the first and the second portions.

18 Claims, 6 Drawing Sheets

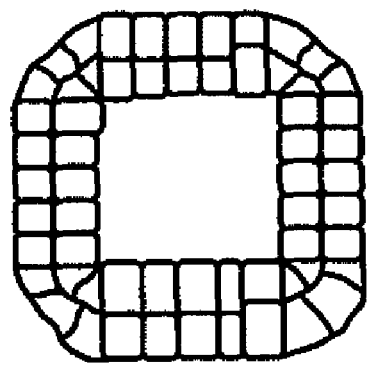 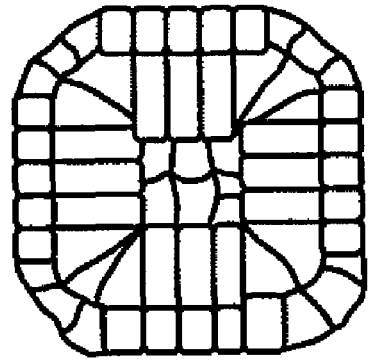
FIG.4A            FIG.4B
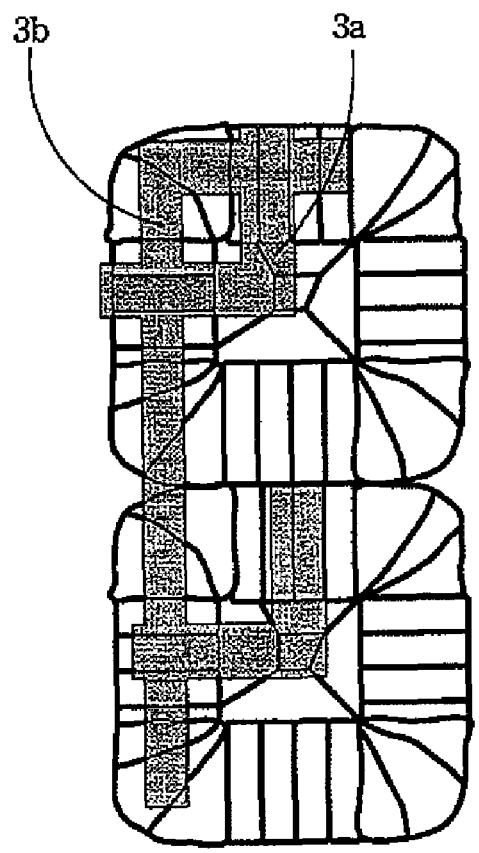
FIG.4C

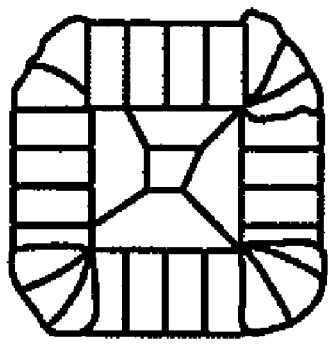 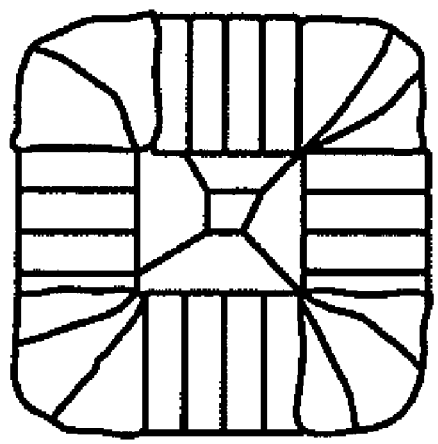
FIG.5A            FIG.5B
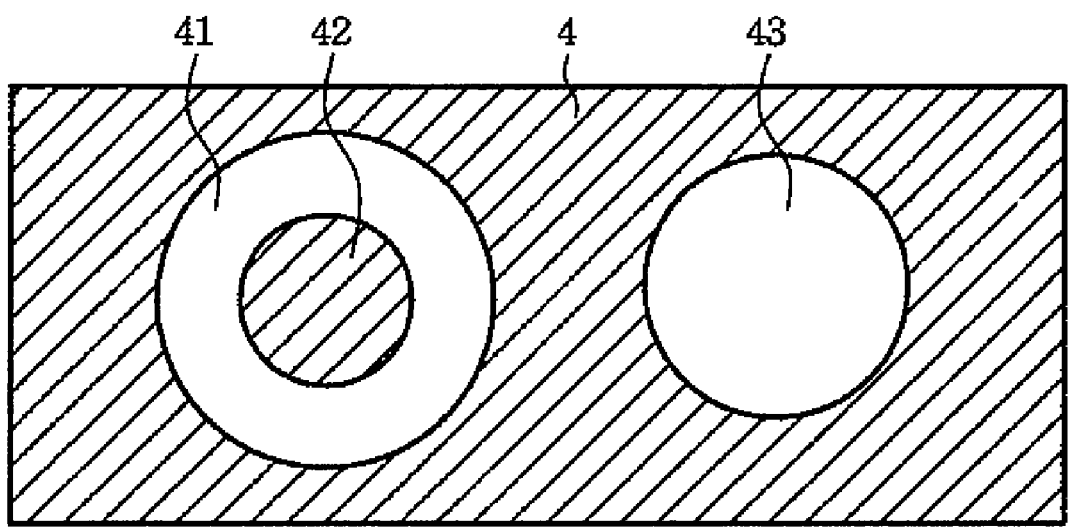
FIG.6

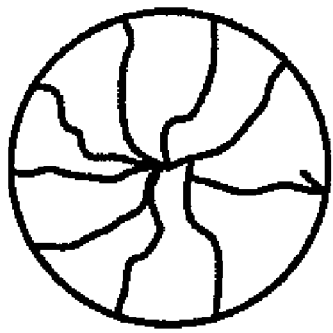
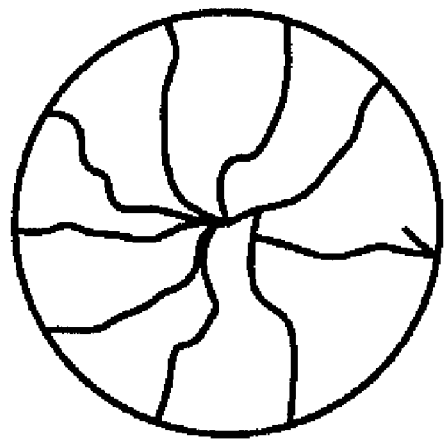
FIG.7A  FIG.7B
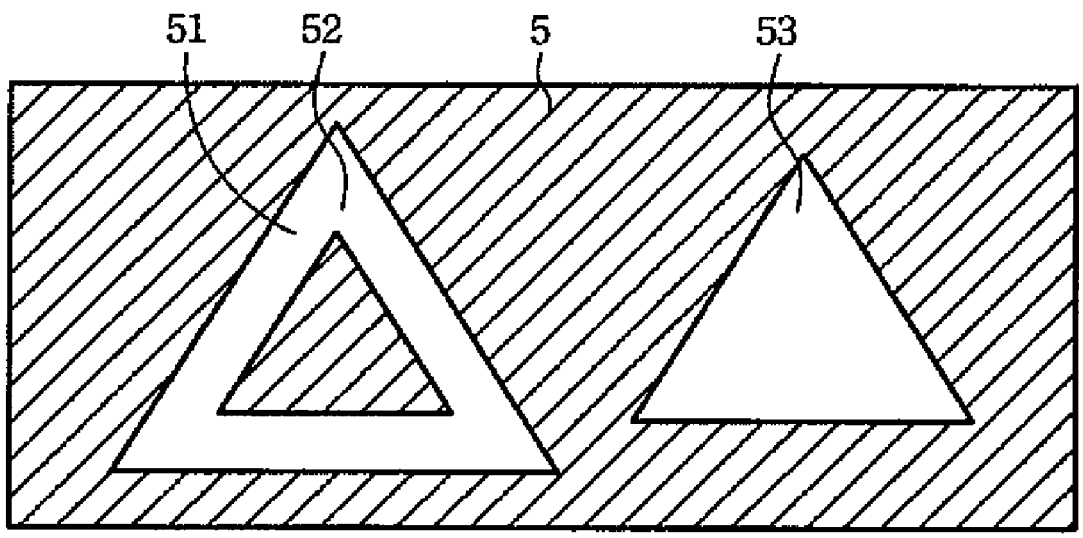
FIG.8

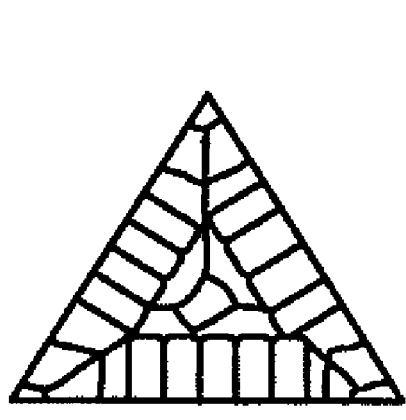
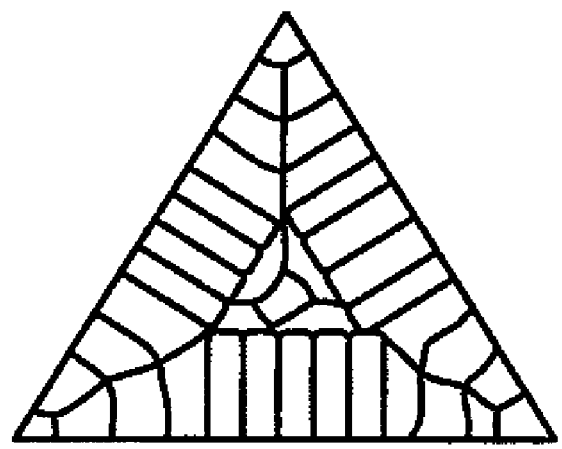
FIG. 9A　　　　　　　FIG. 9B
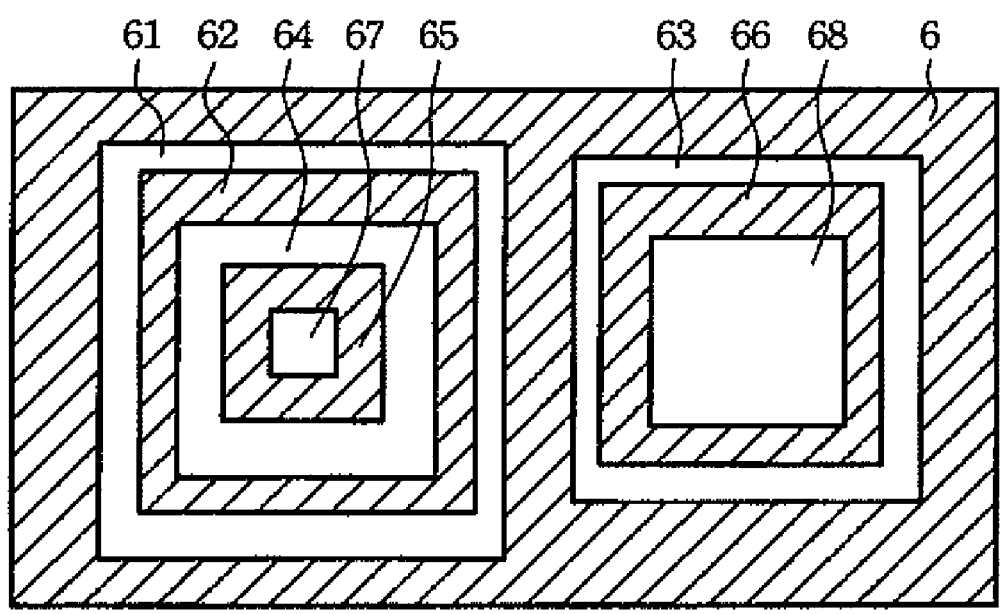
FIG. 10

SEQUENTIAL LATERAL SOLIDIFICATION MASK

This application claims the benefit of Taiwan Application Serial No. 094118439, filed Jun. 3, 2005, the subject matter of which is incorporated herein by reference.

BACKGROUND OF THE INVENTION (1) Field of the Invention

The present invention relates to a mask for polycrystalline silicon fabrication processes, especially to a sequential lateral solidification (SLS) mask which could be used for crystallizing an amorphous silicon film onto a multi-boundary polycrystalline silicon.

(2) Description of the Prior Art

Thin film transistors (TFTs) are widely applied to liquid crystal display (LCD) devices. In the art, two materials, the amorphous silicon (a-Si) and the polycrystalline silicon (poly-Si), are known to be two of major materials for forming the TFTs.

The polycrystalline silicon has lots of characters and is superior to the amorphous silicon while being used in the LCD. For instance, the polycrystalline silicon has bigger grains so that the speed of the response time of the TFT using the polycrystalline silicon is faster than that using the amorphous silicon. Furthermore, a poly-Si TFT LCD can use a backlight module to lower its power consumption.

Low Temperature Polycrystalline silicon (LTPS) process is a common process to crystallize the amorphous silicon. The LTPS usually uses Excimer laser as its heat source. While the laser beam irradiates onto an amorphous silicon film, the amorphous silicon film absorbs energy of the laser beam and is transformed into a polycrystalline silicon film.

One method of crystallizing the amorphous silicon into polycrystalline silicon is a sequential lateral solidification (SLS), which using a technique of Excimer laser annealing. SLS crystallization uses the fact that silicon grains tend to grow laterally from the boundary of the liquid silicon and the solid silicon. With the SLS, the amorphous silicon is crystallized by using a laser beam having a sufficient magnitude and a relative motion to melt the amorphous silicon, such that the melted silicon can grow laterally silicon grains in recrystallization.

Please refer to FIG. 1A, which is a schematic cross-section view showing how a poly-Si film is fabricated by the SLS. As shown, an amorphous silicon film 11 formed by a chemical vapor deposition or sputtering is located on a substrate 10, and a mask 2 is disposed above the amorphous silicon film 11. The mask 2 comprises a plurality of light transmitting slits 21 and light absorptive slits 22. Please refer to FIG. 1B, a laser beam irradiates the mask 2 along the direction shown by arrows in FIG. 1A with a back-and-forth scanning pattern of stroking horizontally but feeding vertically (as a figure view of FIG. 1B). After the amorphous silicon film 11 is well irradiated, a lateral-growth poly-Si is then formed.

Please refer to FIG. 1C, which shows the pattern formed by the above process via the mask 2. The grain boundary 111 in FIG. 1C is perpendicular to the growing direction of the grains. According to various tests, channels of the TFTs could have better electrical performance while they are arranged parallel to the growing direction of the grains. For the above reason, almost all channels of the TFTs in the art have been designed parallel to each other, and such arrangements restrict the design variety in circuit patterning.

Therefore, how to remove the limitation caused by the grain-growing direction is necessary and important.

SUMMARY OF THE INVENTION

The object of the present invention is to provide an SLS mask which can be used for crystallizing an amorphous silicon film into a multi-boundary polycrystalline silicon.

Another object of the present invention is to provide an SLS mask which can be used for producing poly-Si pattern with at least two grain growing directions.

According, a mask used in a SLS process to fabricate a multi-boundary polysilicon has a first portion, a second portion, and a third portion. The first and the third portions are pervious to light, and the second portion is opaque to shield light. The peripheral configurations of above three portions are the same but the sizes are different. The first portion surrounds the second portion, and the third portion is parallel to both the first and the second portions.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood form the detailed description given hereinbelow and the accompanying drawings, which are given by way of illustration only, and thus are not limitative of the present invention, and in which:

FIG. 4A~FIG. 4C show the pattern of the poly-Si film produced from processes in FIG. 3.

FIG. 5A~FIG. 5B show another pattern of the poly-Si film produced from the processes in FIG. 3;

FIG. 6 shows another embodiment of the mask of the present invention;

FIG. 7A~FIG. 7B show the pattern of the poly-Si film produced from the mask in FIG. 6;

FIG. 8 shows a further embodiment of the mask of the present invention;

FIG. 9A~FIG. 9B show the pattern of the poly-Si film produced from the mask in FIG. 8; and FIG. 10 shows one more embodiment of the mask of the present invention.

DETAILED DESCRIPTION OF THE PREFERRED EMBODIMENT

Figure 1A:
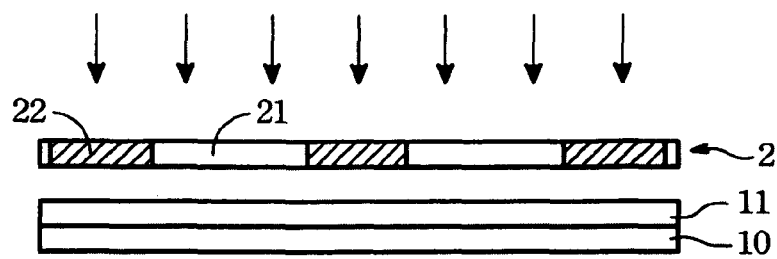
FIG. 1A is a schematic cross-section view showing how a poly-Si film is fabricated by an SLS.
Figure 1B:
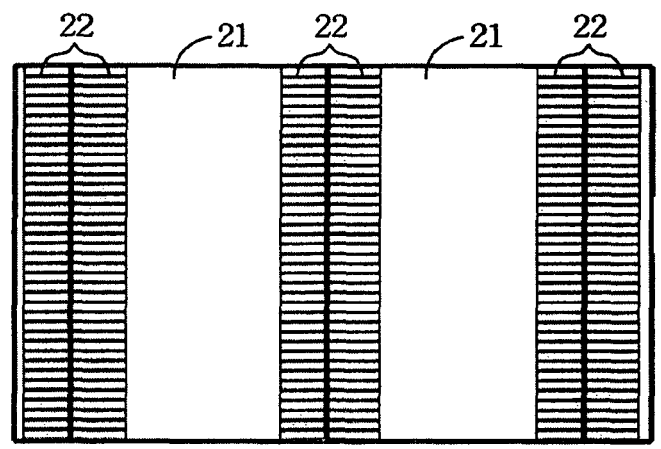
FIG. 1B is a top view of the mask 2 of FIG. 1A.
Figure 1C:
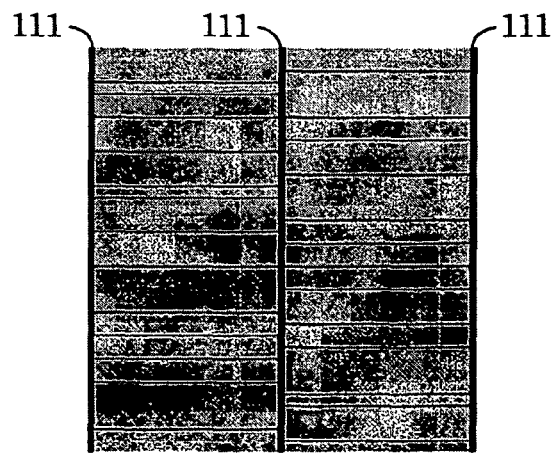
FIG. 1C shows the pattern of the poly-Si formed via the mask 2 of FIG. 1B.
Figure 2:
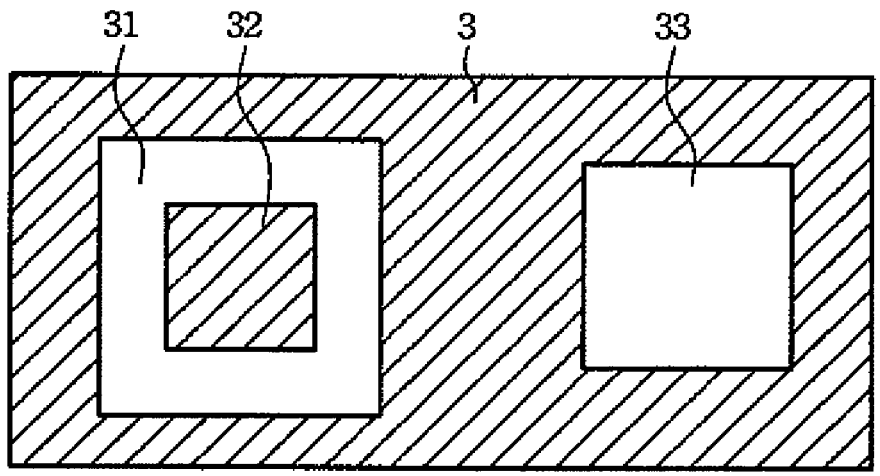
FIG. 2 is a schematic top-view of one embodiment of the mask of the invention.

Please refer to FIG. 2, which is a schematic top-view of one embodiment of the mask of the invention. As shown, the mask 3 comprises a first portion 31, a second portion 32, and a third portion 33, where the first portion 31 and the third portion 33 are pervious to light, and the second portion 32 is light absorptive or configured to shield light.

As shown, the second portion 32 is surrounded by the first portion 31. The peripheral configurations of the first portion 31, the second portion 32, and the third portion 33 are all rectangular. The third portion 33 is disposed parallel to both the first portion 31 and the second portion 32 by spaced by a predetermined direction.

Figure 3:
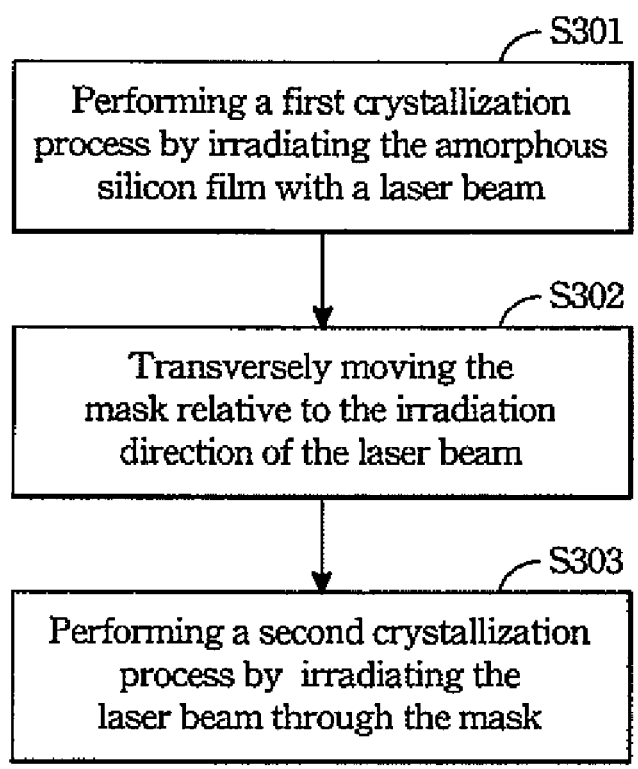
FIG. 3 shows a preferred flowchart of using the mask of the present invention in an SLS.

The mask of the present invention is an SLS mask which can be used for crystallizing an amorphous silicon film to a multi-boundary polycrystalline silicon. Please refer to FIG. 3, which shows the flowchart of using the mask in the SLS. The processes of utilizing the mask include:

STEP 301(S301): performing a first crystallization process by irradiating the amorphous silicon film by a laser beam applied through the first portion 31 or the third portion 33 of the mask 3.

STEP 302 (S302): moving a relative position of the mask 3 and the irradiation direction of the laser beam, in which moving the mask relative to the irradiation direction of the laser beam can be accomplished via moving the mask and/or moving the irradiation direction of the laser beam.

STEP 303 (S303): performing a second crystallization process by irradiating the laser beam applied through the mask 3, in which the irradiation direction is moved from the first portion 31 to the third portion 33 (in the case that, in S303, the first portion 31 is irradiated first) or from the third portion 33 to the first portion 31 (in the case that, in S303, the third portion 33 is irradiated first).

Please refer to FIG. 4A~FIG. 4B, which show the pattern of poly-Si film produced from the above processes. After the first crystallization process, the melted silicon begins lateral growing at the interface between the liquid and the solid silicon (where the temperature is lower than other melted portions) to form the grain boundaries as shown in FIG. 4A. In the second crystallization process, for the light transmitted portion and the light absorptive/or shielding portion of the mask are reversed, hence the pattern of FIG. 4B is formed.

In the present invention, the irradiation direction of the laser beam applied through the mask could influence the poly-Si pattern. FIG. 4A and FIG. 4B show the poly-Si pattern after the laser beam irradiates the mask in direction from the first portion 31 to the third portion 33. If the laser beam irradiates the mask in direction from the third portion 33 to the first portion 31, the poly-Si pattern would be the one shown in FIG. 5A and FIG. 5B. The object of the present invention is to provide a mask and get a poly-Si pattern with at least two direction grain boundaries. Hence, no matter what direction of the laser beam is, the object of the present invention can be accomplished by having the laser beam to irradiate different portions of the mask in a predetermined sequence.

In the present invention, the arrangement between the light transmitted portion and the light absorptive/or shielding portion follows a conception of graph complementary. Furthermore, the sizes of different portions in the mask are different. For instance, the third portion 33 has an area between the area of the first portion 31 and that of the second portion 32. This is because silicon grains tend to grow laterally from the interface between the liquid and the solid silicon (i.e. the boundary of the second portion 32). To resolve the problem or fact that a higher probability of bad grains is correlated to a quicker grain growth, the overlapping of the laser beam irradiation in accordance with the present invention is right provided to help achieving a perfect grain structure.

By providing the mask of the present invention, a poly-Si film with at least two growth directions of the grains can be obtained. With the poly-film of the present invention, a dual-gate thin film transistor (TFT) can present a uniform and better electrical performance. Please refer to FIG. 4C, which is a schematic view of a TFT channel 3a and a gate line 3b in the poly-Si patterns that are fabricated via the mask 3 described above.

Herein, it should be aware and thus understood that, in the present invention, the graph peripheral configuration on the mask is not only limited to that shown in FIG. 2. In practice, a graph design which is frame shaped and has at least two major directions is suitably applied to the mask of the present invention. Please refer to FIG. 6 and FIG. 8, which show another two embodiments of the present invention. The mask 4 shown in FIG. 6 has a first portion 41, a second 42, and a third portion 43, in which these three portions 41, 42 and 43 are all circular shape, contrarily to the rectangular shape portions in the mask 3 of FIG. 2. By applying the mask 4 to the SLS, the poly-Si pattern shown in FIG. 7A and FIG. 7B can be obtained. On the other hand, in FIG. 8, the first portion 51, the second portion 52, and the third portion 53 of the mask 5 are all triangular shape, and thereby the poly-Si pattern as shown in FIG. 9A and FIG. 9B can be obtained from utilizing the mask 5 of FIG. 8.

The number of portions pervious to light and the number configured to shieldlight in the present invention are not limited. As long as the design fits in the complementary frame shaped structure, a plurality of different light transmitted and absorptive/or shielding portions can also be designed into the mask of the present invention. In particular, please refer to FIG. 10, which shows one more embodiment of the present invention. The mask 6 shown in FIG. 10 comprises a first portion 61, a second 62, a third portion 63, a fourth portion 64, a fifth portion 65, a sixth portion 66, a seventh portion 67, and an eighth portion 68. As shown, the first portion 61, the third portion 63, the fourth portion 64, the seventh portion 67, and the eighth portion 68 are defined as portions pervious to light, while the second portion 62, the fifth portion 65, and the sixth portion 66 are defined as portions configured to shield light. As noted, the peripheral configurations of all the portions 61-68 are all rectangular form.

Namely, the design of different sized portions in the mask 6 is resembled to the other embodiments mentioned above. For instance, the sixth portion 66 has an area between the area of the second portion 62 and that of the fourth portion 64, and the eighth portion 68 has an area between the area of the fourth portion 64 and that of the fifth portion 65.

Comparing to prior arts, the present invention further has advantages as follows.

1. Having the design concept in complementary graphing of the mask in accordance with the present invention can help to form a desired poly-Si pattern with at least two grain-growing directions.

2. A perfect grain boundary can be obtained by controlling the sizes of the different portions on the mask.

While the present invention has been particularly shown and described with reference to a preferred embodiment, it will be understood by those skilled in the art that various changes in form and detail may be without departing from the spirit and scope of the present invention.

I claim:

1. A sequential lateral solidification (SLS) mask for crystallizing a polycrystalline silicon from an amorphous silicon film, comprising:
   a first portion pervious to light for crystallizing the polycrystalline silicon from the amorphous silicon film, said first portion being enclosed by an impervious portion;
   a second portion configured to shield the light and surrounded by the first portion;

a third portion pervious for crystallizing the polycrystalline silicon from the amorphous silicon film to light and disposed parallel to the first portion and the second portion in a predetermined direction, wherein the third portion has the same periphery configuration as that of the first portion and each of the first portion and the third portion has at least one continuous boundary;

a fourth portion pervious to light, wherein the fourth portion is surrounded by the second portion; and a fifth portion configured to shield the light and surrounded by the third portion.

2. The SLS mask of claim 1, wherein the periphery configuration of the first portion is the same as that of the second portion.

3. The SLS mask of claim 1, wherein the periphery configuration of the second portion is the same as that of the fourth portion.

4. The SLS mask of claim 1, wherein the periphery configuration of the third portion is the same as that of the fifth portion.

5. The SLS mask of claim 1, wherein the fifth portion has an area between the area of the second portion and that of the fourth portion.

6. The SLS mask of claim 1, further comprising a sixth portion pervious to light, wherein the sixth portion is surrounded by the fifth portion.

7. The SLS mask of claim 6, wherein the periphery configuration of the fifth portion is the same as that of the sixth portion.

8. The SLS mask of claim 1, wherein the periphery configuration of the first portion and that of the second portion are both triangular.

9. The SLS mask of claim 1, wherein the periphery configuration of the first portion and that of the second portion are both circular.

10. The SLS mask of claim 1, wherein the periphery configuration of the first portion and that of the second portion are both elliptical.

11. The SLS mask of claim 1, wherein the periphery configuration of the first portion and that of the second portion are both rectangular.

12. A method of forming a polysilicon film by using the mask of claim 1, comprising:
  a. performing a first crystallization process by irradiating an amorphous silicon film by a laser beam applied through said first portion of the mask;
  b. moving a relative position of the mask and an irradiation direction of the laser beam; and
  c. performing a second crystallization process by irradiating the amorphous film by the laser beam applied through said third portion of the mask, wherein the laser beam is moved in a direction from the first portion to the third portion of the mask.

13. The method of claim 12, wherein the step b is accomplished by moving the mask.

14. The method of claim 12, wherein the step b is accomplished by moving the irradiation direction of the laser beam.

15. A method of forming a polysilicon film by using the mask of claim 1, comprising:
  a. performing a first crystallization process by irradiating an amorphous silicon film by a laser beam applied through said third portion of the mask;
  b. moving a relative position of the mask and an irradiation direction of the laser beam; and
  c. performing a second crystallization process by irradiating the amorphous film by the laser beam applied through said first portion of the mask, wherein the laser beam is moved in a direction from the third portion to the first portion of the mask.

16. The SLS mask of claim 1, wherein the continuous boundary is applied to separate an area pervious to light from another area not pervious to light.

17. The SLS mask of claim 1, wherein outside areas of the continuous boundary are not pervious to light.

18. The SLS mask of claim 1 further comprising a fourth portion configured to shield the light surrounding the first, second, and third portions.

* * * * *